(12) United States Patent
Kitahara (10) Patent No.: US 10,597,913 B2
(45) Date of Patent: Mar. 24, 2020

(54) DOOR HANDLE DEVICE (71) Applicant: TOKYO PARTS INDUSTRIAL CO., LTD., Gunma-ken (JP)

(72) Inventor: Takahisa Kitahara, Gunma-ken (JP)

(73) Assignee: TOKYO PARTS INDUSTRIAL CO., LTD. (JP)

( * ) Notice: Subject to any disclaimer, the term of this patent is extended or adjusted under 35 U.S.C. 154(b) by 511 days.

(21) Appl. No.: 15/375,300

(22) Filed: Dec. 12, 2016

(65) Prior Publication Data

US 2017/0234042 A1 Aug. 17, 2017

(30) Foreign Application Priority Data

Jan. 14, 2016 (JP) .................................. 2016-004844

(51) Int. Cl.
| | |
|---|---|
| *E05B 85/16* | (2014.01) |
| *E05B 81/76* | (2014.01) |
| *H01H 13/50* | (2006.01) |
| *H01H 13/14* | (2006.01) |
| *E05B 77/34* | (2014.01) |
| *H03K 17/96* | (2006.01) |
| *H05K 5/00* | (2006.01) |
| *H05K 5/02* | (2006.01) |
| *E05B 81/78* | (2014.01) |

(52) U.S. Cl.
CPC .............. *E05B 85/16* (2013.01); *E05B 77/34* (2013.01); *E05B 81/76* (2013.01); *E05B 81/77* (2013.01); *H01H 13/14* (2013.01); *H01H 13/50* (2013.01); *H03K 17/962* (2013.01); *H05K 5/0017* (2013.01); *H05K 5/0217* (2013.01); *H05K 5/0239* (2013.01); *E05B 81/78* (2013.01); *H03K 2217/960755* (2013.01)

(58) Field of Classification Search
CPC ..... Y10T 292/82; Y10T 292/57; E05B 77/34; E05B 85/10; E05B 85/14; E05B 85/16; E05B 85/18; E05B 81/76; E05B 81/77; E05B 81/78; H01H 13/14; H01H 13/50
USPC ........................................ 200/520, 341, 345
See application file for complete search history.

(56) References Cited

U.S. PATENT DOCUMENTS

| | | | |
|---|---|---|---|
| 2005/0061646 A1* | 3/2005 | Ferri .................. | H01R 13/6485 200/341 |
| 2006/0180453 A1* | 8/2006 | Steidle .................. | H01H 13/52 200/341 |

(Continued)

FOREIGN PATENT DOCUMENTS

JP 2015-025261 2/2015

*Primary Examiner* — Alyson M Merlino
(74) *Attorney, Agent, or Firm* — Jordan and Koda, PLLC (57) ABSTRACT

A control unit 20, including a circuit board and a switch unit, is arranged in a housing space in a door handle. The switch unit has a switch component, which is fastened to the circuit board, a hard switch case, which covers the switch component, a soft pushbutton, which operates the switch component, and a hard cover member, which is fastened to the switch case. The pushbutton has a pushing part in the shape of a cap, a flange, which extends from the bottom end of the pushing part, and an operation projection, which is inserted into an insertion opening in a roof. The switch case and the pushbutton are united by the cover member, and the flange is brought into close contact with the roof all the way therearound, by the cover member.

12 Claims, 4 Drawing Sheets (56) References Cited

U.S. PATENT DOCUMENTS

| | | | |
|---|---|---|---|
| 2007/0091627 A1* | 4/2007 | Nitawaki | E05B 81/78 362/501 |
| 2011/0284352 A1* | 11/2011 | Kitahara | H01H 13/06 200/341 |
| 2012/0006664 A1* | 1/2012 | Kitahara | E05B 81/76 200/341 |
| 2013/0048482 A1* | 2/2013 | Saitou | E05B 85/16 200/341 |
| 2013/0248336 A1* | 9/2013 | Kitahara | H01H 13/52 200/293 |
| 2014/0061014 A1* | 3/2014 | Satou | E05B 81/76 200/302.2 |
| 2014/0061016 A1* | 3/2014 | Satou | E05B 81/76 200/338 |
| 2014/0203574 A1* | 7/2014 | Noda | E05B 81/77 292/336.3 |
| 2014/0233360 A1* | 8/2014 | Koshoji | H01H 13/06 200/341 |
| 2015/0001861 A1* | 1/2015 | Fujiwara | E05B 85/12 292/336.3 |
| 2016/0160539 A1* | 6/2016 | Saitou | E05B 85/16 292/336.3 |
| 2017/0213660 A1* | 7/2017 | Kitahara | H01H 13/14 |

\* cited by examiner

DOOR HANDLE DEVICE

BACKGROUND OF THE INVENTION

The present invention relates to a door handle device that can be mounted, for example, on the outer panel of a vehicle door.

Japanese Patent Laid-Open Publication No. 2015-25261 describes a vehicle door handle device, wherein a vehicle door is provided with an operating handle comprising a handle main body having an housing recess for housing and fastening a board on which an electronic component such as a tact switch is mounted, and a cover member, which is joined to the handle main body so as to cover this housing recess, in which a tact switch, which switches switching modes in accordance with push-operations of an operation button facing the outer surface of the cover member, is electrically connected to a printed circuit on the board, and fastened accommodated within the housing recess, the interior of the housing recess being filled with a potting agent.

With the handle device described in Japanese Patent Laid-Open Publication No. 2015-25261, a switch cover made from an elastic material, which covers the tact switch, is connected to the operation button, and this switch cover is integrally provided with a flange which abuts the face of the board so as to surround the periphery of the tact switch. Furthermore, the flange on the switch cover is trapped between the board and a hold down member, which is engaged with the handle main body, and the press stroke of the operation button is regulated to no greater than a predetermined value by this hold down member.

The handle device described in Japanese Patent Laid-Open Publication No. 2015-25261 allows for a reduction in the number of assembly steps and simplification of the assembly work, and because the press stroke of the operation button is regulated to no greater than a predetermined value by the hold down member, application of excessive pushing loads to the tact switch can be prevented.

Furthermore, the handle device described in Japanese Patent Laid-Open Publication No. 2015-25261 makes it possible to bring the flange on the switch cover into close contact across the face of the board, so that ingress of water or potting agent toward the tact switch can be prevented.

However, with the handle device described in Japanese Patent Laid-Open Publication No. 2015-25261, the button is separated from the switch cover and the hold down member, and thus problems such as the following may occur.

First, there is a risk of the potting agent flowing between the operation button and the hold down member when filling with the potting agent, and supposing that the potting agent were to flow between these, it might not be possible to ensure normal operation of the tact switch in accordance with the push-operations of the operation button.

Furthermore, there is a risk of foreign matter getting between the operation button and the hold down member prior to the cover member being mounted on the handle main body, and thus it may not be possible to ensure normal operation of the tact switch in accordance with the push-operations of the operation button.

Furthermore, there is a possibility of ingress of water droplets between the operation button and the hold down member when the vehicle is used and, if these water droplets freeze in a cold climate, there is a risk of not being able to perform the push-operations of the operation button.

Furthermore, the handle device described in Japanese Patent Laid-Open Publication No. 2015-25261 does not have a structure that guides the pushing direction of the operation button, and therefore the operability of the tact switch may be inferior in cases where, for example, the operation button is pushed from an oblique lateral direction.

SUMMARY OF THE INVENTION

One or more embodiments of the present invention provide a highly reliable door handle device, which solves the aforementioned problems included in the prior art. Note that, in the aspects described below, the constituent elements employed can be used in the most freely chosen combinations possible. Furthermore, the aspects and technical features of the present invention are not limited to those described hereafter, and are to be understood based on the description in the entire specification and the drawings, or based on the inventive ideas that can be grasped by the skilled artisan on the basis of these descriptions.

A first aspect of the present invention is a door handle device comprising: a door handle, in which a housing space is formed at the interior by a first handle member and a second handle member that is joined to the first handle member; and a control unit arranged in the housing space, wherein:

the control unit includes a circuit board fastened to an inner surface of the first handle member, and a switch unit arranged on the top face of the circuit board;

the switch unit has a switch component, which is fastened to the top face of the circuit board, a hard switch case, which is fastened on the top face of the circuit board, arranged so as to cover the switch component, a soft pushbutton for operating the switch component, and a hard cover member, which is fastened to the switch case or the first handle member;

the switch case has a tubular part, the bottom end face of which abuts the circuit board, and a roof, located at the top of the tubular part and provided with an insertion opening in a portion facing the switch component;

the pushbutton has a pushing part, in the shape of a cap, facing the exterior via an opening provided in the second handle member, an annular flange extending from the bottom end of the pushing part, and an operation projection, inserted into the insertion opening and facing the switch component;

the flange is brought into close contact with the roof, all the way therearound, by the cover member; and the press stroke of the pushing part is regulated by the roof.

A second aspect of the present invention is a door handle device comprising: a door handle, in which a housing space is formed at the interior by a first handle member and a second handle member that is joined to the first handle member; and a control unit arranged in the housing space, characterized in that:

the control unit includes a circuit board fastened to an inner surface of the first handle member, and a switch unit arranged on the top face of the circuit board;

the switch unit has a switch component fastened to the top face of the circuit board, a hard switch case fastened to the top face of the circuit board, arranged so as to cover the switch component, and a soft pushbutton for operating the switch component;

the switch case has a tubular part, the bottom end face of which abuts the circuit board, and a roof, located at the top of the tubular part and provided with an insertion opening in a portion facing the switch component;

the pushbutton has a pushing part, in the shape of a cap, facing the exterior via an opening provided in the second handle member, an annular flange extending from the bottom end of the pushing part, and an operation projection, inserted into the insertion opening and facing the switch component;

the flange is brought into close contact with the roof, all the way therearound, by the second handle member; and the press stroke of the pushing part is regulated by the roof.

According to one mode of embodiment of the door handle device of the present invention, the switch component is directly fastened to the top face of the circuit board and therefore lead wires for connecting the printed wires on the circuit board to the terminals of the switch component are unnecessary, such that space for routing the lead wires will be unnecessary, whereby the size of the door handle device can be reduced. Furthermore, the operation projection, which faces the switch component, is inserted into the insertion opening in the roof, the structure being such as to guide the pushing direction of the pushbutton, whereby the switch component can be reliably operated, even in the event of pushing from an oblique lateral direction.

Furthermore, according to one embodiment of the door handle device of the present invention, the bottom end face of the tubular part of the switch case that covers the switch component abuts the circuit board, the switch case that covers the switch component is united with the pushbutton for operating the switch component, and the pushbutton flange is brought into close contact with the roof of the switch case all the way therearound. Consequently, it is possible to effectively prevent ingress of potting agent, foreign matter or water droplets into the switch case, or into the space between the switch case and the pushbutton, allowing normal operation of the switch component in accordance with push-operations of the pushbutton to be ensured.

DETAILED DESCRIPTION OF THE PREFERRED EMBODIMENTS

Hereafter, exemplary modes of embodiment of the present invention are described with reference to the drawings.

Figure 1:
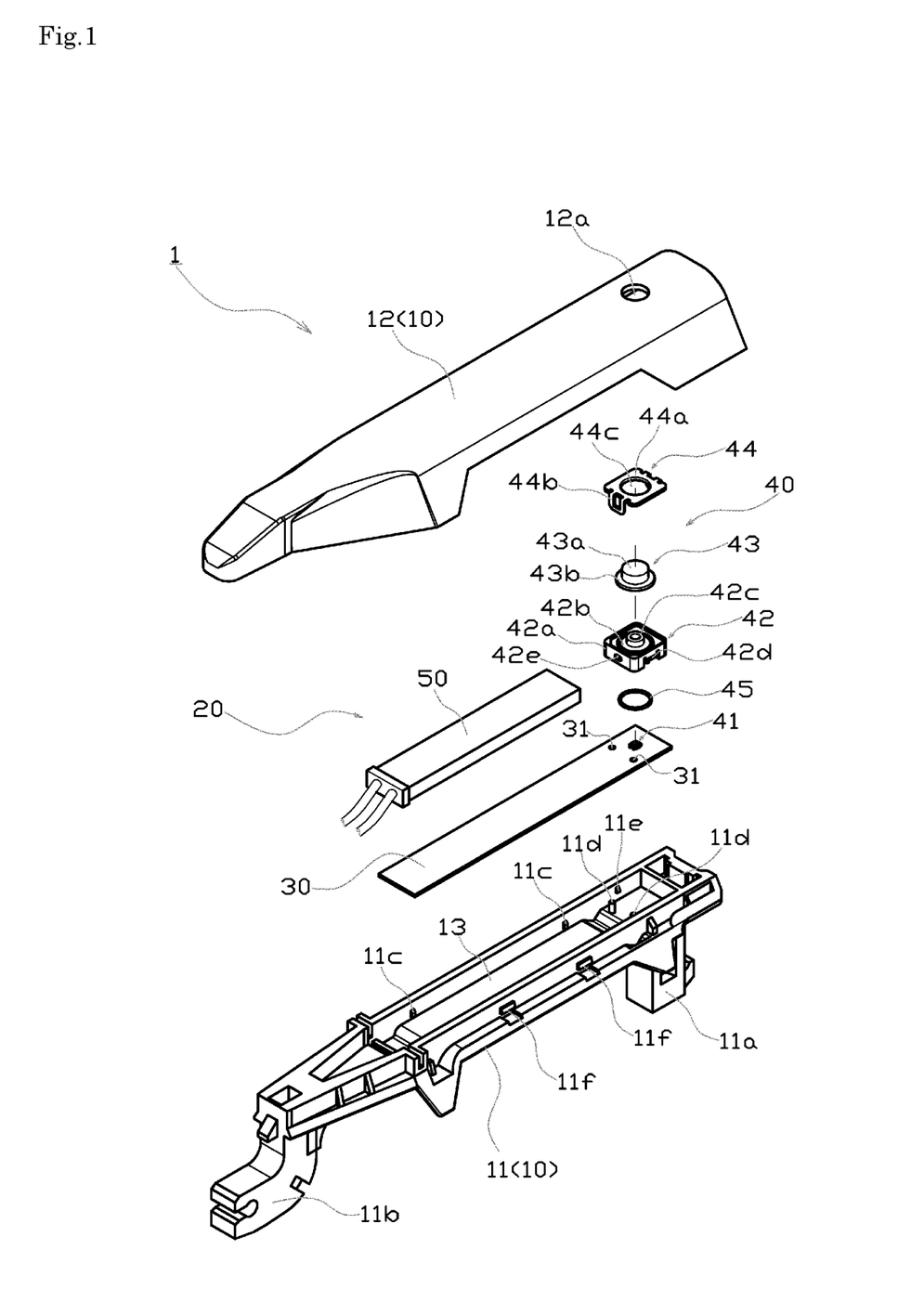
FIG. 1 is an exploded perspective view of a door handle device according to a first exemplary mode of embodiment of the present invention.
Figure 2:
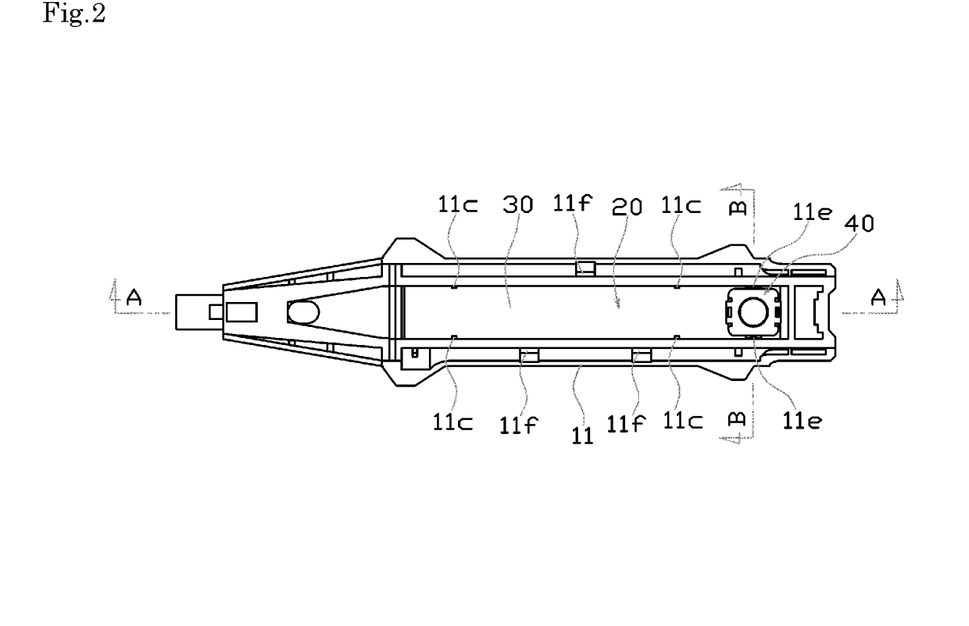
FIG. 2 is a top view showing the situation in which the circuit board and the switch unit have been assembled in the first handle member, in the door handle device according to the first exemplary mode of embodiment of the present invention.
Figure 3:
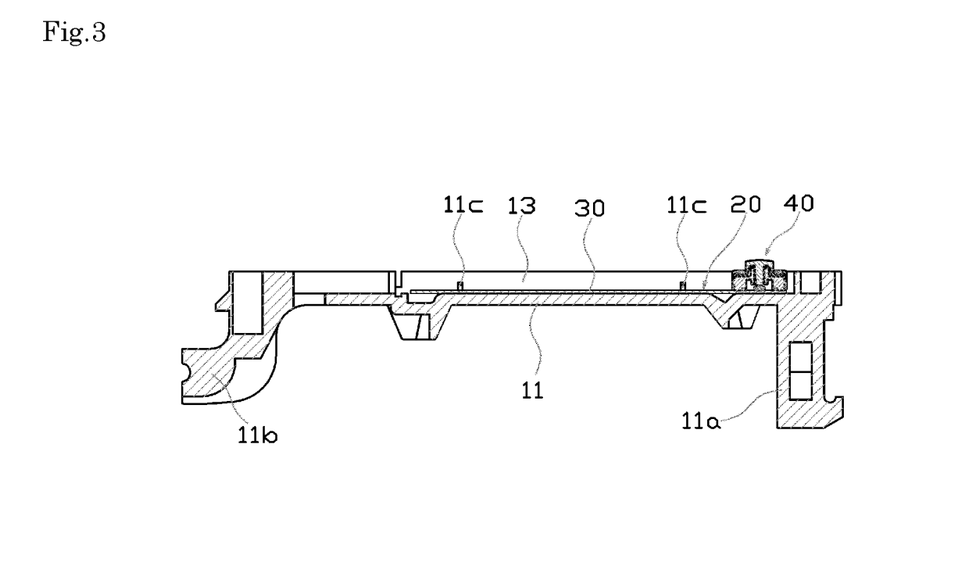
FIG. 3 is a sectional view at the line A-A in FIG. 2.
Figure 4:
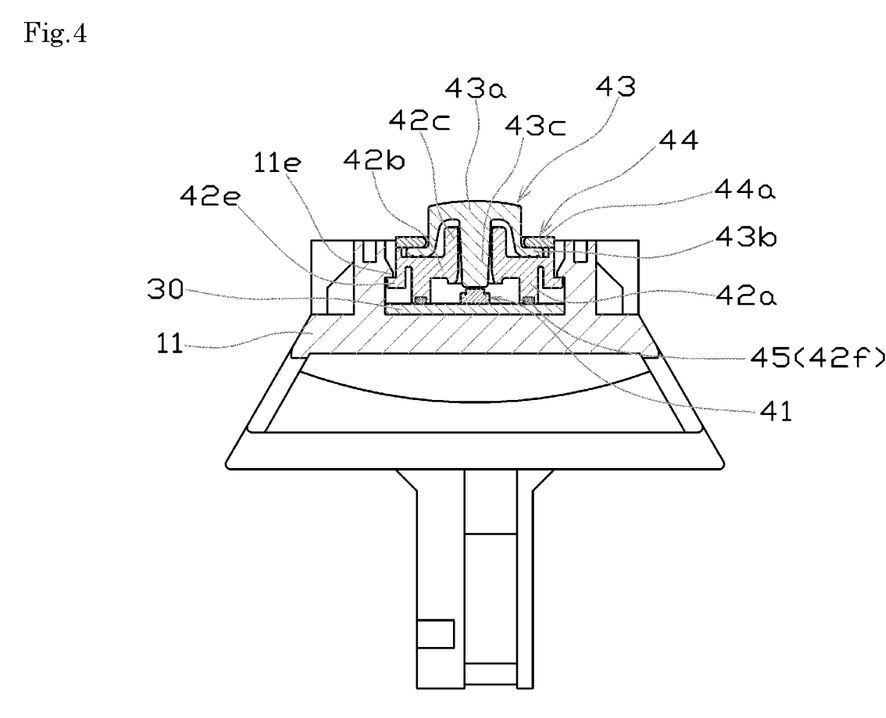
FIG. 4 is an enlarged sectional view at the line B-B in FIG. 2.

Note that, in the present specification, the upward direction in FIG. 1 is referred to as "upper," "upward" and the like and the downward direction in FIG. 1 is referred to as "lower," "downward" and the like. Furthermore, the upward and downward directions do not indicate the positional relationships or directions when the door handle device is assembled in a vehicle or the like.

First Exemplary Embodiment

The configuration of the door handle device in this example will be described using FIG. 1 through FIG. 5.

The door handle device 1 in this example is mounted on the outer panel of a vehicle door so as to allow for opening and closing operations of the vehicle door from the outside, and is provided with a door handle 10 and a control unit 20.

The door handle 10 comprises a first handle member 11 and a second handle member 12, which are formed from a synthetic resin, in shapes that are elongate in the front/rear direction of the vehicle body, and housing space 13, which is elongate in the front/rear direction of the vehicle body, is formed at the interior thereof.

The first handle member 11 is integrally provided with an operating part 11a and a support part 11b, at the front end and the rear end thereof, respectively, which penetrate into the outer panel of the vehicle door. This first handle member 11 is mounted on the outer panel so as to extend in the front/rear direction of the vehicle.

First locking claws 11c, fitting projections 11d, second locking claws 11e, and third locking claws 11f are provided on the first handle member 11.

The first locking claws 11c serve to fasten a circuit board 30, which is described hereafter, in the housing space 13, and are provided in a total of four places (only two places can be seen in FIG. 1) protruding inward from the sidewalls that form the housing space 13.

The fitting projections 11d serve to position the circuit board 30 and a switch case 42, which are described hereafter, in the housing space 13, and are provided in two places, protruding upward in a columnar shape from the bottom wall that forms the housing space 13.

The second locking claws 11e serve to fasten the switch case 42, which is described hereafter, in the housing space 13, so as to abut the circuit board 30, and are provided in two places (only one place can be seen in FIG. 1) protruding inward from the sidewalls that form the housing space 13.

The third locking claws 11f serve to join the second handle member 12 to the first handle member 11, and are provided in multiple places (only two places can be seen in FIG. 1) protruding outward from the sidewalls that form the housing space 13.

The second handle member 12 covers the first handle member 11 from the side opposite the vehicle door, and is joined to the first handle member 11 by way of locking by the third locking claws 11f. An opening 12a is provided in the rear portion of the second handle member 12, and exposes a pushing part 43a of a pushbutton 43, which is described hereafter.

The operation part 11a of the door handle 10 is connected to a known latch mechanism and, when the vehicle door is in the unlocked state, the latch mechanism releases the closed state of the vehicle door as a result of the door handle 10 being operated in the direction that pulls the operation part 11a outward from the vehicle door, such that the vehicle door can be opened.

The control unit 20 principally comprises the circuit board 30, the switch unit 40 and an antenna component 50, and is arranged in the housing space 13 formed within the door handle 10.

The circuit board 30 is an elongate flat board, and two positioning holes 31 are provided near the rear end thereof. This circuit board 30 is fastened positioned at a predetermined position within the housing space 13 by fitting the fitting projections 11d of the first handle member 11 in the positioning holes 31 and locking to the first handle member 11 by way of the first locking claws 11c. Note that the circuit board 30 is preferably fastened to the bottom of the first handle member 11 using two-sided adhesive tape so that no gap is formed between the bottom of the first handle member 11 and the circuit board 30.

The circuit board 30 is provided with a sensor electrode, a sensor circuit and wiring, which are not illustrated.

Note that the sensor electrode is formed on the bottom of the circuit board 30 (which is to say, the side closest to the outer panel of the vehicle door). The sensor electrode functions as an electrostatic capacitance sensor that detects a hand or the like of a vehicle user being positioned between the first handle member 11 and the outer panel.

The sensor circuit is formed partially at the rear of the top face of the circuit board 30, and can process signals from the sensor electrode, so as to control the unlocked state of the vehicle door by way of detecting the hand or the like of the vehicle user.

The switch unit 40 functions as a lock switch for confirming the user's intention to lock the vehicle door.

This switch unit 40 comprises a switch component 41, the switch case 42, the pushbutton 43, a cover member 44, and an O-ring 45.

The switch component 41 is fastened on the top face of the circuit board 30. The switch component 41 has a rectangular parallelepiped main body 41a and a columnar operation part 41b, the main body 41a being arranged on the top face of the circuit board 30, and a plurality of non-illustrated terminals that extend downward from the main body 41a being connected to predetermined wires on the circuit board 30.

The operation part 41b protrudes upward from the main body 41a, and is configured so as to be able to move in the vertical direction, biased upward by a non-illustrated elastic member within the main body 41a. Note that, when the operation part 41b is pushed downward, the switch is turned on.

The switch case 42 is made from a hard resin, and is arranged so as to cover the switch component 41 on the top face of the circuit board 30.

This switch case 42 has a rectangular cylinder shaped tubular part 42a, the bottom end face of which abuts the top face of the circuit board 30, and covers the periphery of the switch component 41, and a roof 42b, positioned at the top of the tubular part 42a, which covers the top face of the switch component 41.

Figure 5:
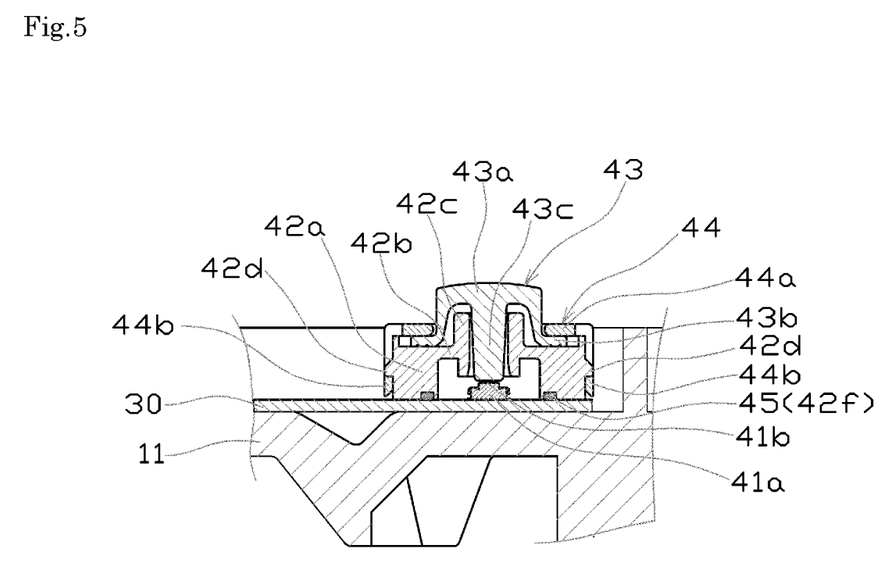
FIG. 5 is an enlarged sectional view of the surroundings of the switch component in FIG. 3.

An annular protrusion 42c, which protrudes upward and downward from the roof 42b is formed in the center of the roof 42b, and an insertion opening (through hole) is provided in the annular protrusion 42c, at a position corresponding to the operation part 41b of the switch component 41.

Two positioning holes (not illustrated) are provided on the bottom end face of the tubular part 42a, and the fitting projections 11d that protrude from the positioning holes 31 in the circuit board 30 fit into these positioning holes, establishing the positioning of the circuit board 30 and the switch case 42.

Furthermore, and annular groove 42f is provided at the bottom end face of the tubular part 42a, and the O-ring 45 is inserted into this groove 42f. Note that the depth of the groove 42f is established at slightly less than the height of the O-ring 45 under ordinary circumstances.

Sectionally L-shaped locking projections 42e, which are slightly elastic, are provided on two facing outer walls of the tubular part 42a, and locking projections 42d are provided on the other two facing outer walls.

The switch case 42 is fastened to the first handle member 11 by locking the locking projections 42e in the second locking claws 11e. Consequently, the bottom end face of the tubular part 42a abuts the top face of the circuit board 30 and the O-ring 45 is compressed and deformed in the groove 42f, so that a gap does not occur between the bottom end face of the tubular part 42a and the top face of the circuit board 30.

The pushbutton 43 is formed from a soft elastic resin such as rubber, and serves to operate the switch component 41.

This pushbutton 43 has: a pushing part 43a, in the shape of a cap, which faces outward from the opening 12a provided in the second handle member 12; an annular flange 43b, which extends outward from the bottom end of the pushing part 43a, and a substantially columnar operation projection 43c, which is inserted into the insertion opening in the annular protrusion 42c, and faces the operation part 41b of the switch component 41. Note that the outer diameter of the operation projection 43c is slightly smaller than the inner diameter of the insertion opening in the annular protrusion 42c, such that a large gap is not formed therebetween.

The cover member 44 is formed from a hard resin and has a rectangular planar pushing face 44a, in the center of which a circular opening 44c is provided, and U-shaped locking arms 44b, which extend downwards from two sides of the pushing face 44a.

This cover member 44 is fastened to the switch case 42 by way of locking the locking arms 44b on the locking projections 42d of the switch case 42. Consequently, the pushing part 43a of the pushbutton 43 protrudes upward from the opening 44c, while the pushing face 44a pushes the top face of the flange 43b on the pushbutton 43, so that the flange 43b maintains close contact with the roof 42b of the switch case 42, and a gap does not form between the roof 42b and the flange 43b.

Note that, in this example, a plurality of annular projections (ribs) are concentrically provided on the bottom face of the flange 43b of the pushbutton 43, and these projections are elastically deformed as a result of being compressed, resulting in a structure that can very effectively prevent the formation of a gap between the roof 42b and the flange 43b.

When the second handle member 12 is joined to the first handle member 11, the pushing part 43a of the pushbutton 43 is exposed to the outside via the opening 12a. As a result of pressing this pushing part 43a from the outside with a finger or the like, the operation projection 43c presses the operation part 41b downward, and the switch component 41 can be turned on. At this time, the press stroke of the pushing part 43a is regulated to no greater than a predetermined value by the roof 42b, whereby excessive pushing loads are prevented from acting on the switch component 41. Specifically, by establishing a suitable distance between the bottom face of the pushing part 43a and the top face of the annular protrusion 42c, the press stroke of the pushing part 43a is regulated to no greater than a predetermined value.

The antenna component 50 is provided with a magnetic core and a coil wound on the magnetic core. Lead wires extend from a resin case in which these are housed. The antenna component 50 is arranged above the circuit board 30. Note that the lead wires of the antenna component 50 lead into the outer panel via a lead groove that is provided in the support part 11b of the first handle member 11, together with lead wires from the circuit board.

Furthermore, in order to prevent malfunctions due to the ingress of water, the interior of the housing space 13 is filled with a potting agent (not illustrated) so as to cover at least the circuit board 30 and the antenna component 50.

The antenna component 50 communicates with a portable device carried by the vehicle user, serving to lock and unlock the vehicle door by remote control. In order to open the vehicle door, the user inserts a hand into the space formed between the door handle 10 and the outer panel and touches the door handle 10, whereupon the electrostatic capacitance of the sensor electrode formed on the circuit board 30 changes, and this change is detected by the detection circuit provided on the circuit board 30, such that a detection signal is output. When the detection signal is output, the vehicle control unit sends a request signal from the antenna 50, and the portable device that has received this request signal transmits its own ID signal. Then, in the vehicle control unit that has received this ID signal, if the ID signal that has been received matches an ID stored in advance, the vehicle door locking device is unlocked, producing a state in which the door can be opened.

In the door handle device 1 in this example described above, the control unit 20, which includes the circuit board 30 and the switch unit 40, is arranged in the housing space 13 of the door handle 10. Furthermore, the switch unit 40 has the switch component 41, which is fastened to the top face of the circuit board 30, the hard switch case 42, which is fastened on the top face of the circuit board 30, arranged so as to cover the switch component 41, the soft pushbutton 43 for operating the switch component 41, and the hard cover member 44, which is fastened to the switch case 42. Furthermore, the switch case 42 has the tubular part 42a, the bottom end face of which abuts the circuit board 30, and the roof 42b, which is positioned at the top of the tubular part 42a, and in which the insertion opening is provided in the portion facing the switch component 41. Furthermore, the pushbutton 43 has a pushing part 43a in the shape of a cap, which faces the outside via the opening 12a provided in the second handle member 12, the annular flange 43b, which extends from the bottom end of the pushing part 43a, and the operation projection 43c, which is inserted into the insertion opening in the roof 42b, and which faces the switch component 41.

With the sort of door handle device 1 in this example, the switch component 41 is fastened directly to the top face of the circuit board 30 on which the sensor electrodes and the sensor circuits and the like are formed, and therefore lead wires for connecting the printed circuits of the circuit board and the switch component 41 are unnecessary, and thus space for routing the lead wires will not be necessary, which allows the size of the door handle device to be reduced. Furthermore, the operation projection 43c, which faces the switch component 41, is inserted into the insertion opening in the roof 42b, the structure being such as to guide the pushing direction of the pushbutton 43, whereby the switch component can be reliably turned on, even in the event of pushing from an oblique lateral direction.

Furthermore, with the door handle device 1 in this example, the bottom end face of the tubular part 42a of the switch case 42, which covers the switch component 41, abuts the circuit board 30, and the switch case 42 and the pushbutton 43 are united by the cover member 44, such that the flange 43b on the pushbutton 43 is brought into close contact with the roof 42b of the switch case 42 all the way therearound, by the cover member 44. Consequently, it is possible to effectively prevent ingress of potting agent, foreign matter or water droplets into the switch case 42, or into the space between the switch case 42 and the pushbutton 43, allowing normal operation of the switch component 41 in accordance with push-operations of the pushbutton 43 to be ensured.

Furthermore, in the door handle device 1 in this example, the press stroke of the pushing part 43a is regulated by the roof 42b of the switch case 42. Consequently, excessive pushing loads can be prevented from acting on the switch component 41, which ensures long-term reliability of the switch unit 40.

Furthermore, in the door handle device 1 of this example, the roof 42b of the switch case 42 has an annular protrusion 42c in which an insertion hole is formed, and the movement of the operation projection 42c when the pushing part 43a is push-operated is guided along the inner circumferential face of the insertion opening in the annular protrusion 42c. Consequently, the skirt of the pushing part 43a, which is elastically deformed by the push-operation of the pushbutton 43 can be established with a relatively great length, so that the push-operation is smooth, and the pushing direction of the pushbutton 43 can be very effectively guided, allowing the switch component 41 to be smoothly and reliably turned on, even when pushed from an oblique lateral direction.

Furthermore, with the door handle device 1 in this example, the circuit board 30 is locked by the first locking claws 11c provided on the inner surface of the first handle member 11, and the switch case 42 is locked by the second locking claws 11e provided on the inner surface of the first handle member 11, such that the pushbutton 43 is united with the switch case 42 by the cover member 44, which is fastened to the switch case 42. Consequently, the work of assembling the circuit board 30 and the switch unit 40 on the first handle member 11 can be simplified.

Second Exemplary Embodiment

Figure 6:
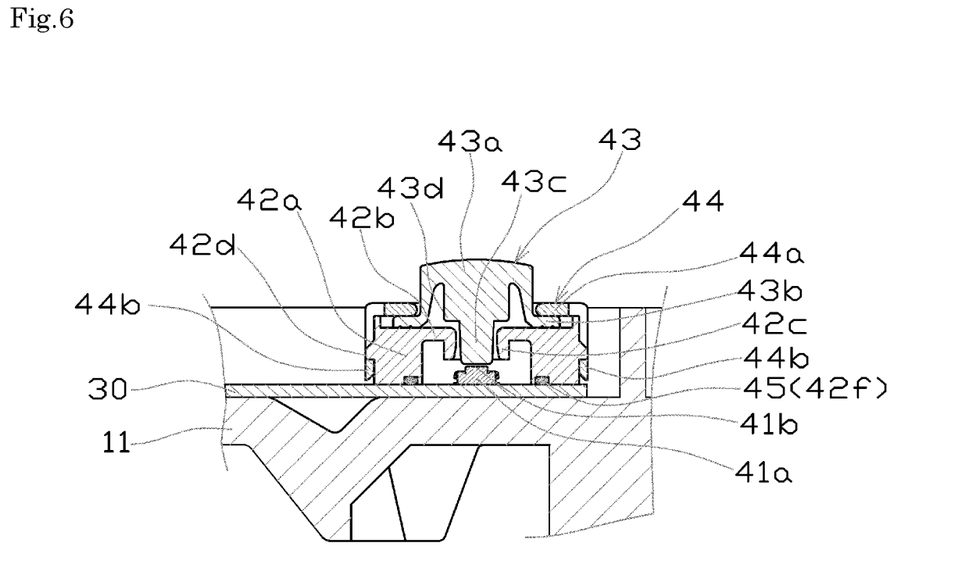
FIG. 6 is an enlarged sectional view of the surroundings of the switch component corresponding to FIG. 5, which is a schematic view of a door handle device according to a second exemplary mode of embodiment of the present invention.

The configuration of the door handle device in this example will be described using FIG. 6. In FIG. 6, constituent parts that are the same as in the first exemplary mode of embodiment are given the same reference numerals, and redundant description thereof is forgone.

In this example, the major differences with respect to the first exemplary embodiment reside in the following two points.

First, in the switch case 42 in the first exemplary mode of embodiment, an annular protrusion 42c is formed so as to protrude, in both the upward direction and the downward direction, from the roof 42b, but in the switch case 42 in the present example, an annular protrusion 42c is formed so as to protrude only in the downward direction from the roof 42b.

Furthermore, in the pushbutton 43 in the first exemplary embodiment, a substantially columnar operation projection 43c is formed, but with the pushbutton 43 in the present example, a striking part 43d, having a larger diameter than the operation projection 43c is provided above the operation projection 43c.

In the door handle device in the present example, when the pushing part 43a is pressed, the striking part 43d strikes the roof 42b of the switch case 42. Consequently, excessive pushing loads can be prevented from acting on the switch component 41, which ensures long-term reliability of the switch unit 40. Specifically, by establishing a suitable distance between the bottom face of the striking part 43d and the top face of the roof 42b, the press stroke of the pushing part 43a is regulated to no greater than a predetermined value.

In the first exemplary embodiment, the press stroke of the pushing part 43a is regulated by the top face of the annular protrusion 42c striking the bottom face of the relatively thin pushing part 43a, and therefore there is a risk of cracks forming in the pushing part 43a if a particularly great force is applied.

Meanwhile, in the present example, the striking part 43d, which is thick in the pushing direction, strikes the flat roof 42b, and therefore while producing an effect similar to that in the first exemplary mode of embodiment, the formation of cracks in the pushing part 43a can be effectively prevented, whereby long-term reliability can be still further improved.

Third Exemplary Embodiment

Figure 7:
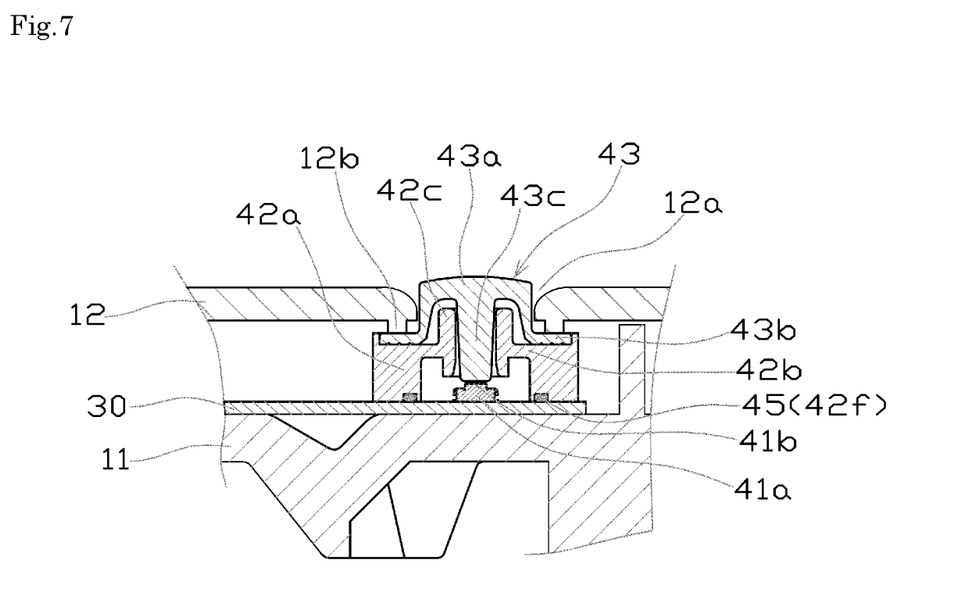
FIG. 7 is an enlarged sectional view of the surroundings of the switch component corresponding to FIG. 5, which is a schematic view of a door handle device according to a third exemplary mode of embodiment of the present invention.

The configuration of the door handle device in this example will be described using FIG. 7. In FIG. 7, constituent parts that are the same as in the first exemplary mode of embodiment are given the same reference numerals, and redundant description thereof is forgone.

In the first exemplary embodiment, the flange 43b on the pushbutton 43 was brought into close contact with the roof 42b by the cover member 44, but in the present example, the flange 43b on the pushbutton 43 is brought into close contact with the roof 42b by the second handle member 12, without using the cover member.

For this reason, in the present example, an annular projection 12b, which protrudes downwards, is provided at the periphery of the opening 12a in the second handle member 12, and a structure results with which, as a result of joining the second handle member 12 to the first handle member 11, the annular protrusion 12b pushes the flange 43b on the pushbutton 43 all the way therearound, so as to bring the flange 43b on the pushbutton 43 into close contact with the roof 42b.

Note that, in the present example, it is preferable that the flange 43b on the pushbutton 43 is temporarily fastened by fitting, or with an adhesive or two-sided tape or the like, on the roof 42b of the switch case 42, so as to prevent ingress of foreign matter into the switch case 42 or the space between the switch case 42 and the pushbutton 43 prior to the second handle member 12 being joined to the first handle member 11.

In the present example as well, effects similar to those of the first exemplary mode of embodiment are produced, but the cover member 44 that was used in the first exemplary mode of embodiment is not necessary, and therefore a further reduction in parts is possible.

Three embodiments of the present invention were described above, but the present invention is not limited to these embodiments and, needless to say, suitable changes and the like are possible within a scope that does not depart from the gist of the present invention.

Specifically, for example, in the first exemplary embodiment, the cover member 44 was fastened to the switch case 42 by locking, but the cover member 44 may be fastened to the first handle member 11 by locking, by way of forming locking claws for locking the cover member 44 on the first handle member 11. In this case as well, the configuration is such that the flange 43b is held in close contact with the roof 42b of the switch case 42, all the way therearound, and a gap will not be formed between the roof 42b and the flange 43b.

Furthermore, in the exemplary embodiment described above, an annular protrusion 42c was provided on the switch case 42, but it is not absolutely necessary to provide an annular protrusion 42c, so long as the pushing direction of the pushbutton 43 can be guided in the insertion opening into which the operation projection 42 is inserted.

Furthermore, in the exemplary embodiments described above, a pushing part 43b of the soft cover member 43 was exposed via the opening 12a provided in the second handle member 12, but a separate hard cap may be used, fitted so as to cover the pushing part 43b, and this hard cap may be exposed via the opening 12a.

The invention claimed is:

1. A door handle device comprising: a door handle, in which a housing space is formed at an interior by a first handle member and a second handle member that is joined to the first handle member; and a control unit arranged in the housing space, wherein:
   the control unit includes a circuit board fastened to an inner surface of the first handle member, and a switch unit arranged on a top face of the circuit board; the switch unit has a switch component, which is fastened to the top face of the circuit board, a switch case, which is fastened on the top face of the circuit board and arranged so as to cover the switch component, a pushbutton for operating the switch component, and a cover member, which is fastened to the switch case;
   the switch case has a tubular part, a bottom end face of which abuts the circuit board, and a roof, located at a top of the tubular part and provided with a through hole in a portion facing the switch component;
   the pushbutton has a pushing part facing an exterior of the door handle via an opening provided in the second handle member, an annular flange extending from a bottom end of the pushing part, and an operation projection, inserted into the through hole and facing the switch component;
   the annular flange is always brought into close contact with the roof, all the way therearound, by the cover member; and
   a press stroke of the pushing part is regulated by the roof.

2. The door handle device according to claim 1, wherein:
   the roof has an annular protrusion formed around the through hole;
   movement of the operation projection when the pushing part is push-operated is guided along an inner circumferential face of the through hole; and
   the press stroke of the pushing part is regulated by the annular protrusion.

3. The door handle device according to claim 1, wherein:
   the circuit board is locked by at least one first locking claw provided on the inner surface of the first handle member; and
   the switch case is locked by at least one second locking claw provided on the inner surface of the first handle member.

4. The door handle device according to claim 1, wherein:
   the control unit further comprises an antenna component arranged above the circuit board; and
   the interior of the housing space is filled with a potting agent so as to cover at least the circuit board and the antenna component.

5. The door handle device according to claim 1, wherein the operation projection extends through the through opening into contact with the switch component.

6. The door handle device according to claim 1, wherein the annular flange is
- in contact with said top of the tubular part and the cover member while said switch component is in an on position and while said switch component is in an off position.

7. A door handle device comprising: a door handle, in which a housing space is formed at an interior by a first handle member and a second handle member that is joined to the first handle member; and a control unit arranged in the housing space, wherein:
- the control unit includes a circuit board fastened to an inner surface of the first handle member, and a switch unit arranged on a top face of the circuit board;
- the switch unit has a switch component fastened to the top face of the circuit board, a switch case fastened to the top face of the circuit board and arranged so as to cover the switch component, and a pushbutton for operating the switch component;
- the switch case has a tubular part, a bottom end face of which abuts the circuit board, and a roof, located at a top of the tubular part and provided with a through hole in a portion facing the switch component;
- the pushbutton has a pushing part facing an exterior of the door handle via an opening provided in the second handle member, an annular flange extending from a bottom end of the pushing part, and an operation projection, inserted into the through hole and facing the switch component;
- the annular flange is always brought into close contact with the roof, all the way therearound, by the second handle member; and
- a press stroke of the pushing part is regulated by the roof.

8. The door handle device according to claim 7, wherein:
- the roof has an annular protrusion formed around the through hole;
- movement of the operation projection when the pushing part is push-operated is guided along an inner circumferential face of the through hole; and
- the press stroke of the pushing part is regulated by the annular protrusion.

9. The door handle device according to claim 7, wherein:
- the circuit board is locked by at least one first locking claw provided on the inner surface of the first handle member; and
- the switch case is locked by at least one second locking claw provided on the inner surface of the first handle member.

10. The door handle device according to claim 7, wherein:
- the control unit further comprises an antenna component arranged above the circuit board; and
- the interior of the housing space is filled with a potting agent so as to cover at least the circuit board and the antenna component.

11. The door handle device according to claim 7, wherein the operation projection extends through the through opening into contact with the switch component.

12. The door handle device according to claim 7, wherein the annular flange is in contact with said top of the tubular part and the second handle member while said switch component is in an on position and while said switch component is in an off position.

* * * * *